US012806581B2

(12) United States Patent
Wang et al.

(10) Patent No.: US 12,806,581 B2
(45) Date of Patent: Nov. 24, 2026

(54) ATOMIZATION CIRCUIT MODULE AND ATOMIZER HEAD

(71) Applicant: Zhangzhou iHastek Inc., Zhangzhou (CN)

(72) Inventors: Wenquan Wang, Zhangzhou (CN); Canyu Wang, Zhangzhou (CN); Yueneng Wang, Zhangzhou (CN)

(73) Assignee: Zhangzhou iHastek Inc., Zhangzhou (CN)

( * ) Notice: Subject to any disclaimer, the term of this patent is extended or adjusted under 35 U.S.C. 154(b) by 245 days.

(21) Appl. No.: 18/791,564

(22) Filed: Aug. 1, 2024

(65) Prior Publication Data

US 2026/0021457 A1 Jan. 22, 2026

(30) Foreign Application Priority Data

Jul. 22, 2024 (CN) ........................ 202421732997.5

(51) Int. Cl.

*B01F 23/213* (2022.01)
*B01F 31/80* (2022.01)
*H03K 17/687* (2006.01)
*B01F 101/55* (2022.01)

(52) U.S. Cl.

CPC .......... *B01F 23/2133* (2022.01); *B01F 31/89* (2022.01); *H03K 17/6871* (2013.01); *B01F 2101/55* (2022.01)

(58) Field of Classification Search

CPC .. B01F 23/2133; B01F 31/89; B01F 2101/55; H03K 17/6871; F24F 6/00
USPC ................................ 261/78.1, 78.2, DIG. 15
See application file for complete search history.

(56) References Cited

U.S. PATENT DOCUMENTS 6,629,646 B1 * 10/2003 Ivri ..................... B05B 17/0669 239/4
8,296,993 B2 * 10/2012 Modlin ............... B05B 17/0661 43/132.1
2009/0159720 A1 * 6/2009 Fang .................. B05B 17/0646 310/358
2021/0187538 A1 * 6/2021 Hu .......................... A61L 9/122
2023/0280054 A1 * 9/2023 Chao .................. B01F 23/2133 261/78.1

* cited by examiner

*Primary Examiner* — Frank M Lawrence, Jr.
(74) *Attorney, Agent, or Firm* — COOPER LEGAL GROUP LLC

(57) ABSTRACT

An atomization circuit module includes a voltage stabilization module and a microcontroller module, an input terminal of the voltage stabilization module is connected to a power supply, an output terminal of the voltage stabilization module is connected to the microcontroller module, and the microcontroller module outputs pulse width modulation (PWM) signals with variable duty factors to control an atomization sheet to oscillate at a resonant frequency. An atomizer head includes the atomization circuit module, the atomization sheet, and a housing of the atomizer head, the atomization circuit module is electrically connected to the atomization sheet and the housing of the atomizer head, and the atomization circuit module and the atomization sheet are both disposed in the housing of the atomizer head.

16 Claims, 4 Drawing Sheets

ATOMIZATION CIRCUIT MODULE AND ATOMIZER HEAD

RELATED APPLICATIONS

This application claims priority to Chinese patent application number 202421732997.5, filed on Jul. 22, 2024. Chinese patent application number 202421732997.5 is incorporated herein by reference.

FIELD OF THE DISCLOSURE

The present disclosure relates to a humidification device, and in particular relates to an atomization humidification device.

BACKGROUND OF THE DISCLOSURE

An ultrasonic atomizer uses ultra-high frequency oscillation (e.g., an oscillation frequency of 1.7 MHz/2.4 MHz) to disperse water droplets into about 5 μm ultrafine particles through high-frequency resonance with an atomization sheet and then diffuses the ultrafine particles through a pneumatic device, therefore continuously producing suspended water mist, and ultimately achieving an effect of moistening air. Moreover, 1.7 MHz/2.4 MHz cannot be heard by human ears. In dry weather, an indoor humidity environment can be effectively improved, and human body comfort is increased.

At present, ultrasonic atomization technology is widely used in humidifiers, aromatherapy machines, and medical atomization devices. A traditional atomizer head adopts a self-excited oscillation technology of simulated components, and ultrasonic oscillation is generated through piezoelectric materials to achieve the atomization effect.

The traditional atomizer head adopts the self-excited oscillation technology of the simulated components, and this solution requires a large number of components. When the large number of components are assembled together, an overall structure is relatively large, so an overall size of the traditional atomizer head is also relatively large. Moreover, the components are exposed to a moist environment, and the components are prone to corrosion and damage, resulting in product failure.

The self-excited oscillation technology is used to generate oscillation signals. Setting of parameters of all of the components is relatively complex, resulting in a long debugging cycle. Moreover, a driving frequency is not easy to adjust, and an optimal resonant frequency cannot be found through real-time adjustment by the driving frequency. During use, the parameters of the components will cause frequency deviation, and resonance will not occur, resulting in failures when the frequency deviation is beyond a certain range.

BRIEF SUMMARY OF THE DISCLOSURE

The present disclosure provides an atomization circuit module to overcome deficiencies of a self-excited oscillation technology.

In order to solve the aforementioned technical problems, the present disclosure provides an atomization circuit module, the atomization circuit module comprises a voltage stabilization module and a microcontroller module, an input terminal of the voltage stabilization module is connected to a power supply, an output terminal of the voltage stabilization module is connected to the microcontroller module, and the microcontroller module outputs pulse width modulation (PWM) signals with variable duty factors to control an atomization sheet to oscillate at a resonant frequency.

In a preferred embodiment, the voltage stabilization module comprises a voltage stabilization chip, the microcontroller module comprises a microcontroller unit, an input terminal of the voltage stabilization chip is connected to the power supply, an output terminal of the voltage stabilization chip is connected to a voltage drain drain (VDD) pin of the microcontroller unit, the input terminal of the voltage stabilization chip is connected to ground (GND) through a first filter capacitor and a second filter capacitor, and the output terminal of the voltage stabilization chip is connected to the GND through a third filter capacitor.

In a preferred embodiment, a PWM output terminal of the microcontroller unit is connected to a source, a drain, and a gate of a switch transistor, and the switch transistor is connected to two ends of the atomization sheet.

In a preferred embodiment, the switch transistor is a metal oxide semiconductor (MOS) transistor, a drain of the MOS transistor is connected to a first end of the two ends of the atomization sheet through a first capacitor, a source of the MOS transistor is connected to a second end of the two ends of the atomization sheet, the source of the MOS transistor, a current-limiting resistor, and a first pin of an input/output (I/O) port of the microcontroller unit define a series connection, and two ends of the current-limiting resistor are connected to the GND respectively through a second capacitor and a third capacitor.

In a preferred embodiment, the second capacitor and a first resistor have a parallel connection.

In a preferred embodiment, the drain of the MOS transistor and a homonymous terminal of the first capacitor are connected to the power supply through an inductor.

In a preferred embodiment, two input/output (I/O) ports of the microcontroller unit are respectively connected to a second resistor and a third resistor for serial interface communication with an external control module.

The present disclosure discloses an atomizer head, the atomizer head comprises the atomization circuit module, the atomization sheet, and a housing of the atomizer head, the atomization circuit module is electrically connected to the atomization sheet and the housing of the atomizer head, and the atomization circuit module and the atomization sheet are both disposed in the housing of the atomizer head.

In a preferred embodiment, the atomization circuit module is electrically connected to an external control module, the external control module is externally connected to the power supply, and one end of the power supply is electrically connected to an inner side of the housing of the atomizer head through the atomization circuit module.

In a preferred embodiment, the housing of the atomizer head is a conductive housing, the conductive housing is an insulating shell with an outer surface wrapped in an electroplated layer, and a positive pole or a negative pole of the power supply is connected to the conductive housing.

Compared with the existing techniques, the technical solution of the present disclosure has the following advantages.

The present disclosure provides an atomization circuit module. Atomization of the atomization sheet is controlled by the atomization circuit module, and an initial duty factor of PWM signals output by the microcontroller module is set. A detection circuit is used to determine whether the atomization sheet has reached a resonance state, and duty factors of the PWM signals are adjusted in real time during use, so that the atomization sheet is maintained at an optimal resonance frequency. Product life is prolonged, and product reliability and product consistency are increased.

The present disclosure provides an atomizer head. An overall size is small, and a housing uses a sealing conductive material. A power supply of an internal circuit of the atomizer head contacts the housing, ensuring good shielding effect of the housing and solving electromagnetic interference (EMI) problems. The atomization sheet is fixed on an upper housing of the housing through a sealing ring. The housing also adopts a sealing structure, and a whole of the atomizer head forms a sealing structure. Merely water contacts the atomization sheet. The power supply and control parts are isolated from water, so that the product has a modular assembly, and service life and efficiency are improved with good safety performance.

DETAILED DESCRIPTION OF THE EMBODIMENTS

Figure 1:
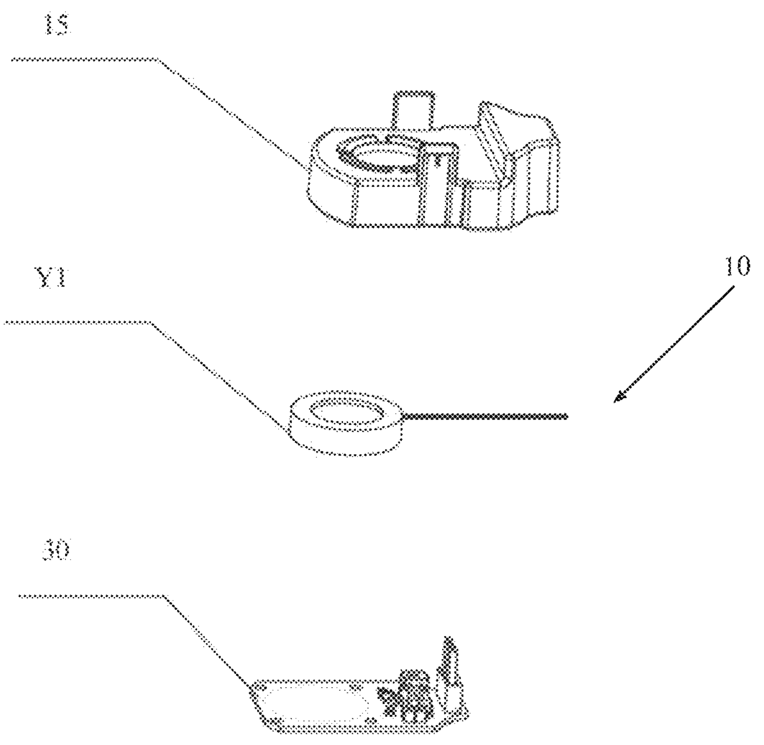
FIG. 1 illustrates an exploded view of an atomizer head in a preferred embodiment of the present disclosure.
Figure 2:
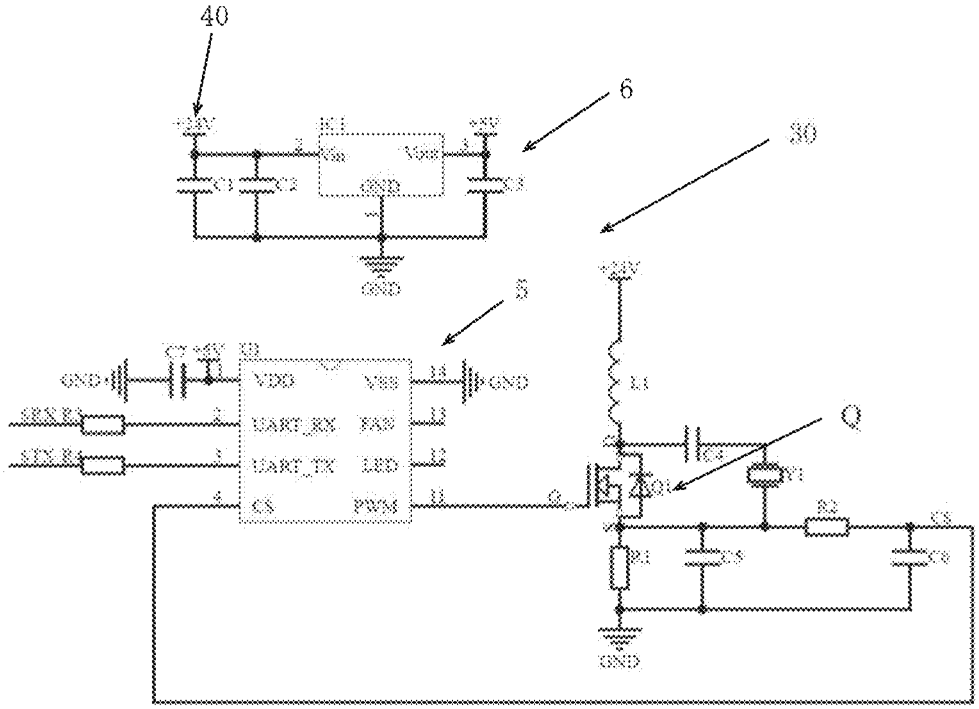
FIG. 2 illustrates a circuit diagram of an atomization circuit module in the preferred embodiment of the present disclosure.
Figure 3:
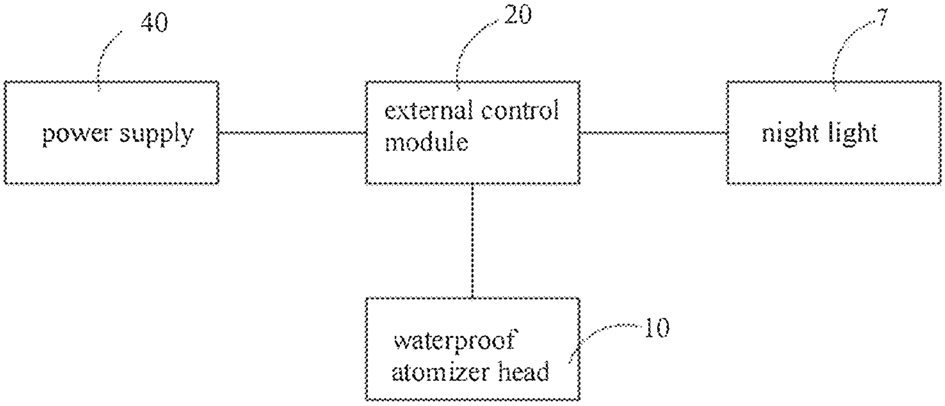
FIG. 3 illustrates a view of module connections of the atomizer head in the preferred embodiment of the present disclosure.

The technical solution in the embodiments of the present disclosure will be clearly and completely described below in combination with the accompanying drawings. It is obvious that the described embodiments are merely a part of the embodiments of the present disclosure instead of all embodiments. All other embodiments fall within the scope of protection of the present disclosure provided that they are obtained by ordinary technical persons skilled in art based on the embodiments of the present disclosure without creative works.

In the description of the present disclosure, it should be noted that terms, such as “upper”, “lower”, “inner”, “outer”, “top”, and “bottom”, indicate orientations or positional relationships based on the orientations or positional relationship described in the drawings, so as to easily describe the present disclosure and simplify the description, rather than indicating or implying that the referenced device or element should have a specific orientation or be constructed and operated in a specific orientation and therefore should not be understood as a limitation of the present disclosure. In addition, terms “first” and “second” are merely used for description and cannot be understood as indicating or implying relative importance.

In the description of the present disclosure, unless otherwise expressly specified and limited, it should be noted that terms, such as “installed”, “disposed”, “sleeved”, “socketed”, and “connected”, should develop broad understanding, for example, “connected” can be a wall-mountable connection, a detachable connection, an integrated connection, a mechanical connection, an electrical connection, a direct connection, an indirect connection through an intermediator, or communication between inner portions of two members, for the ordinary technical persons skilled in the art, specific meaning of the terms in the present disclosure can be understood under specific conditions.

Referring to FIG. 1, this embodiment provides an atomizer head. The atomizer head 10 comprises an atomization circuit module 30, an atomization sheet Y1, and a housing 15 of the atomizer head 10. The atomization circuit module 30 is electrically connected to the atomization sheet Y1 and the housing 15 of the atomizer head 10, and the atomization circuit module 30 and the atomization sheet Y1 are both disposed in the housing 15 of the atomizer head 10.

The atomization circuit module 30 further comprises a voltage stabilization module 6 and a microcontroller module 5. An input terminal of the voltage stabilization module 6 is connected to a power supply 40, and an output terminal of the voltage stabilization module 6 is connected to the microcontroller module 5. The microcontroller module 5 outputs pulse width modulation (PWM) signals with variable duty factors to control the atomization sheet Y1 to oscillate at a resonant frequency.

In the atomization circuit module 30, atomization of the atomization sheet Y1 is controlled by the atomization circuit module 30. An initial duty factor of the PWM signals output by the microcontroller module 5 is set, and a detection circuit is used to determine whether the atomization sheet Y1 has reached a resonance state. Duty factors of the PWM signals are adjusted in real time during use, so that the atomization sheet Y1 is maintained at an optimal resonance frequency. A product life of the atomizer head 10 is prolonged, and product reliability and product consistency are increased.

In this embodiment, the housing 15 of the atomizer head 10 is prepared by a conductive material with sealing performance, and the power supply 40 of an internal circuit of the atomizer head 10 contacts with the housing 15 of the atomizer head 10 to ensure the housing 15 of the atomizer head 10 has good shielding effects and to solve the EMI problems. The atomization sheet Y1 is fixed on the housing 15 of the atomizer head 10 through a sealing ring 112, and the housing 15 of the atomizer head 10 uses a sealing structure to enable the atomizer head 10 to define a sealing structure as a whole. Merely the atomization sheet Y1 contacts water. The power supply 40 and the control parts are insulated from the water, so that the product are assembled by modules, and service life and efficiency are improved with good safety performance.

Specifically, the voltage stabilization module 6 comprises a voltage stabilization chip IC1, and the microcontroller module 5 comprises a microcontroller unit U1. An input terminal of the voltage stabilization chip IC1 is connected to the power supply 40, and an output terminal of the voltage stabilization chip IC1 is connected to a voltage drain drain (VDD) pin 1 (i.e., a first pin 1) of the microcontroller unit U1. The input terminal of the voltage stabilization chip IC1 is connected to ground (GND) through a first filter capacitor C1 and a second filter capacitor C2, and the output terminal of the voltage stabilization chip IC1 is also connected to the GND through a third filter capacitor C3.

A PWM output terminal (i.e., a fifth pin 11) of the microcontroller unit U1 is connected to a gate of a switch transistor Q, such as a metal oxide semiconductor (MOS) transistor Q1. A drain of the MOS transistor Q1 is connected to a first terminal of the atomization sheet Y1 through a first capacitor C4, and a source of the MOS transistor Q1 is connected to a second terminal of the atomization sheet Y1. The source of the MOS transistor Q1, a current-limiting resistor R2, and a fourth pin 4 of an input/output (I/O) port of the microcontroller unit U1 define a series connection. Two ends of the current-limiting resistor R2 are respectively connected to the GND through a second capacitor C5 and a third capacitor C6.

In addition, the second capacitor C5 and a first resistor R1 have a parallel connection. The drain of the MOS transistor Q1 and a homonymous terminal of the first capacitor C4 are connected to the power supply 40 through an inductor L1.

In order to communicate with an external control module 20, the microcontroller unit U1 further comprises a second I/O port and a third I/O port. In this embodiment, a second pin 2 and a third pin 3 of the second I/O port and the third I/O port are respectively connected to a third resistor R3 and a fourth resistor R4 for serial interface communication with the external control module 20.

During use, the voltage stabilization chip IC1 supplies working power to the microcontroller unit U1. The second pin 2 of the microcontroller unit U1 receives a demand signal of an output power size of the external control module 20, and the third pin 3 of the microcontroller unit U1 transmits working information. The fifth pin 11 of the microcontroller unit U1 provides the PWM signals required by the atomization sheet Y1 to control on-off operation of the MOS transistor Q1, so that the atomization sheet Y1 oscillates at a high frequency to disperse water into small particles and form atomization. The inductor L1, the first capacitor C4, and the MOS transistor Q1 form a boost circuit to provide resonant voltage to the atomization sheet Y1. The first resistor R1 is a sampling resistor of working current. Voltage collected by the first resistor R1 is filtered by the second capacitor C5, flows through the current-limiting resistor R2, is filtered by the third capacitor C6, and is read by the fourth pin 4 of microcontroller unit U1. The PWM signals of the fifth pin 11 of the microcontroller unit U1 are corrected by a software algorithm of the microcontroller unit U1, so that the atomization sheet Y1 works in a state with the optimal resonant frequency. During operation, when the microcontroller unit U1 detects that there is no water on a surface of the atomization sheet Y1 through the software algorithm, the microcontroller unit U1 will turn off the PWM signals of the fifth pin 11, the atomization sheet Y1 stops working. At the same time, the microcontroller unit U1 transmits a water shortage signal through the third pin 3.

In this embodiment, logic of the software algorithm is as follows. When a control chip (e.g., the microcontroller unit U1) of an atomization device (e.g., the atomizer head 10) receives a turn-on command, frequency tracking of the atomization sheet Y1 is started. A frequency of the atomization sheet Y1 is added from a low frequency to a high frequency using an oscillation frequency range of the atomization sheet Y1. A voltage of a pin (e.g., the fifth pin 11) is detected for frequency tracking using a feedback circuit of a frequency tracking circuit, thereby achieving a frequency tracking process of the atomization sheet Y1. The frequency tracking circuit can be one or more oscillators and other components, which are used to generate and adjust signals for driving the atomization sheet Y1. After the atomization device is started, various parameters, such as current and voltage, can be detected, recorded, and compared with a preset optimal parameter range during the frequency tracking process of the atomization sheet Y1. If the various parameters detected during the frequency tracking process of the atomization sheet Y1 are within the preset optimal parameter range, the frequency tracking can be considered successful. If the various parameters detected during the frequency tracking process of the atomization sheet Y1 are not within the preset optimal parameter range, the frequency tracking can be considered as having failed.

In this embodiment, the atomization circuit module 30 is electrically connected to the external control module 20, and the external control module 20 is externally connected to the power supply 40. One end of the power supply 40 is electrically connected to an inner side of the housing 15 of the atomizer head 10 through the atomization circuit module 30. The external control module 20 controls a night light 7 and the atomizer head 10. The housing 15 of the atomizer head 10 is a conductive housing 150. Specifically, the conductive housing 150 is an insulating shell 111 with an outer surface wrapped in an electroplated layer 110, and a positive pole or a negative pole of the power supply 40 is connected to the conductive housing.

Figure 4:
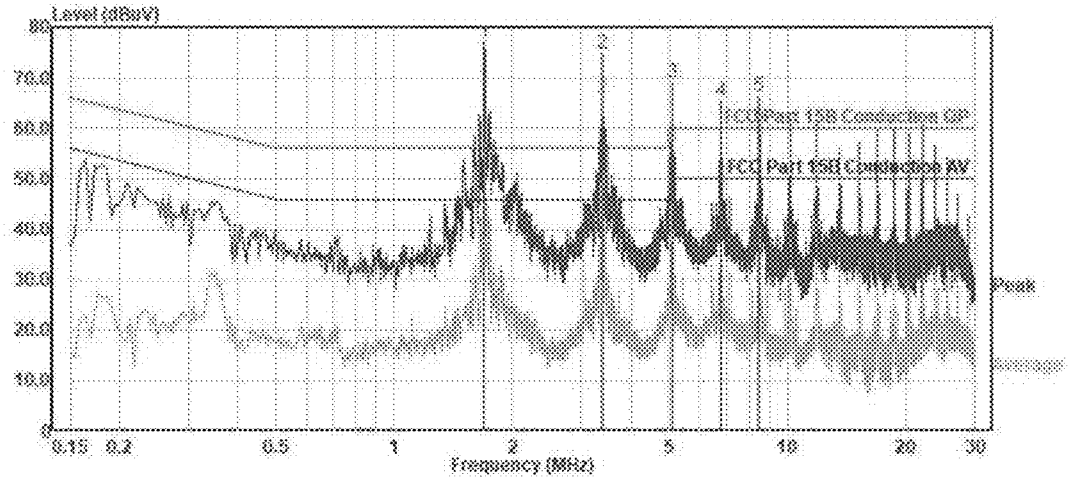
FIG. 4 shows a waveform chart of an electromagnetic interference (EMI) test of a housing of the atomizer head made of a non-conductive material.
Figure 5:
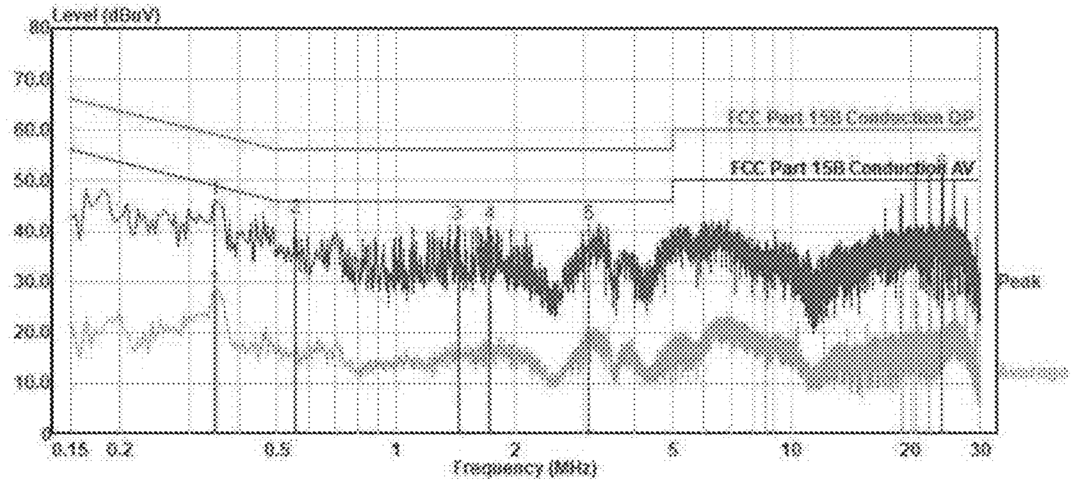
FIG. 5 shows the waveform chart of the EMI test of the housing of the atomizer head in the preferred embodiment of the present disclosure.
Figure 6:
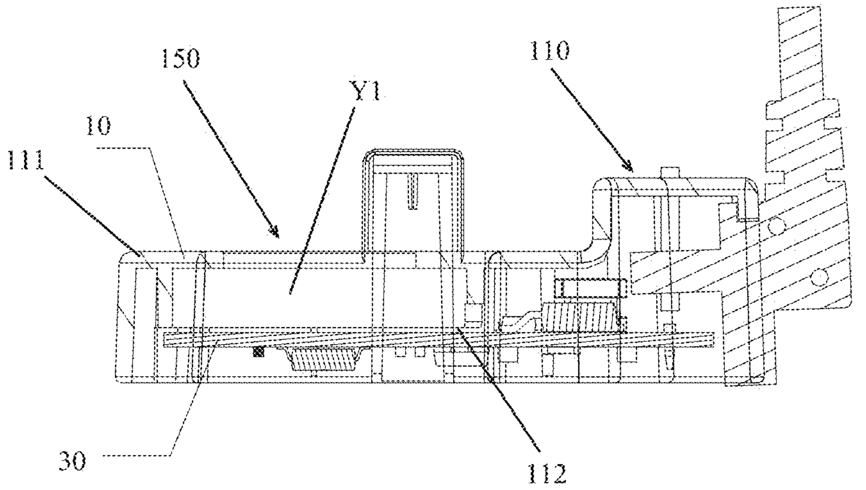
FIG. 6 shows a sectional view of the atomizer head in the preferred embodiment of the present disclosure.

FIG. 4 shows a waveform of a test of the housing 15 of the atomizer head 10 (e.g., a waterproof atomizer head) made of a non-conductive material, and FIG. 5 shows a waveform of the housing 15 of the waterproof atomizer head of the embodiment of the present disclosure. As shown in FIG. 4, when the housing 15 of the atomizer head 10 is made of the non-conductive material, obvious peak interferences in waveforms at 1.7 MHz and 1.7 MHz harmonic frequencies are observed from the waveform of the test. However, when the conductive housing of the embodiment of the present disclosure electrically connected to the power supply 40 is used, as shown in the waveform of the test, an overall waveform is significantly smooth. The waterproof atomizer head having the conductive housing is better than the waterproof atomizer head made of the non-conductive material, resulting in better product performance.

The aforementioned embodiments are merely some embodiments of the present disclosure, and the concepts of the disclosure are not limited thereto. Thus, it is intended that the present disclosure cover non-substantive modifications of the present disclosure provided they are made based on the concept within the technical scope disclosed in the present disclosure by any technical person skilled in the art.

What is claimed is:

1. An atomization circuit module, comprising:

a voltage stabilization module, and a microcontroller module, wherein:

an input terminal of the voltage stabilization module is connected to a power supply, an output terminal of the voltage stabilization module is connected to the microcontroller module, and the microcontroller module outputs pulse width modulation (PWM) signals with variable duty factors to control an atomization sheet to oscillate at a resonant frequency.

2. The atomization circuit module according to claim 1, wherein:

the voltage stabilization module comprises a voltage stabilization chip, the microcontroller module comprises a microcontroller unit, an input terminal of the voltage stabilization chip is connected to the power supply, an output terminal of the voltage stabilization chip is connected to a voltage drain drain (VDD) pin of the microcontroller unit, the input terminal of the voltage stabilization chip is connected to ground (GND) through a first filter capacitor and a second filter capacitor, and the output terminal of the voltage stabilization chip is connected to the GND through a third filter capacitor.

3. The atomization circuit module according to claim 2, wherein:

a PWM output terminal of the microcontroller unit is connected to a source, a drain, and a gate of a switch transistor, and the switch transistor is connected to two ends of the atomization sheet.

4. The atomization circuit module according to claim 3, wherein:

the switch transistor is a metal oxide semiconductor (MOS) transistor, a drain of the MOS transistor is connected to a first end of the two ends of the atomization sheet through a first capacitor, a source of the MOS transistor is connected to a second end of the two ends of the atomization sheet, the source of the MOS transistor, a current-limiting resistor, and a first pin of an input/output (I/O) port of the microcontroller unit define a series connection, and two ends of the current-limiting resistor are connected to the GND respectively through a second capacitor and a third capacitor.

5. The atomization circuit module according to claim 4, wherein the second capacitor and a first resistor have a parallel connection.

6. The atomization circuit module according to claim 4, wherein the drain of the MOS transistor and a homonymous terminal of the first capacitor are connected to the power supply through an inductor.

7. The atomization circuit module according to claim 2, wherein two input/output (I/O) ports of the microcontroller unit are respectively connected to a second resistor and a third resistor for serial interface communication with an external control module.

8. An atomizer head, comprising:

the atomization circuit module according to claim 1, the atomization sheet, and a housing of the atomizer head, wherein:

the atomization circuit module is electrically connected to the atomization sheet and the housing of the atomizer head, and the atomization circuit module and the atomization sheet are both disposed in the housing of the atomizer head.

9. The atomizer head according to claim 8, wherein:

the atomization circuit module is electrically connected to an external control module, the external control module is externally connected to the power supply, and one end of the power supply is electrically connected to an inner side of the housing of the atomizer head through the atomization circuit module.

10. The atomizer head according to claim 9, wherein:

the housing of the atomizer head is a conductive housing, the conductive housing is an insulating shell with an outer surface wrapped in an electroplated layer, and a positive pole or a negative pole of the power supply is connected to the conductive housing.

11. The atomization circuit module according to claim 8, wherein:

the voltage stabilization module comprises a voltage stabilization chip, the microcontroller module comprises a microcontroller unit, an input terminal of the voltage stabilization chip is connected to the power supply, an output terminal of the voltage stabilization chip is connected to a voltage drain drain (VDD) pin of the microcontroller unit, the input terminal of the voltage stabilization chip is connected to ground (GND) through a first filter capacitor and a second filter capacitor, and the output terminal of the voltage stabilization chip is connected to the GND through a third filter capacitor.

12. The atomization circuit module according to claim 11, wherein:

a PWM output terminal of the microcontroller unit is connected to a source, a drain, and a gate of a switch transistor, and the switch transistor is connected to two ends of the atomization sheet.

13. The atomization circuit module according to claim 12, wherein:

the switch transistor is a metal oxide semiconductor (MOS) transistor, a drain of the MOS transistor is connected to a first end of the two ends of the atomization sheet through a first capacitor, a source of the MOS transistor is connected to a second end of the two ends of the atomization sheet, the source of the MOS transistor, a current-limiting resistor, and a first pin of an input/output (I/O) port of the microcontroller unit define a series connection, and two ends of the current-limiting resistor are connected to the GND respectively through a second capacitor and a third capacitor.

14. The atomization circuit module according to claim 13, wherein the second capacitor and a first resistor have a parallel connection.

15. The atomization circuit module according to claim 13, wherein the drain of the MOS transistor and a homonymous terminal of the first capacitor are connected to the power supply through an inductor.

16. The atomization circuit module according to claim 11, wherein two input/output (I/O) ports of the microcontroller unit are respectively connected to a second resistor and a third resistor for serial interface communication with an external control module.

* * * * *